United States Patent [19]

Borth et al.

[11] Patent Number: 4,910,470

[45] Date of Patent: Mar. 20, 1990

[54] DIGITAL AUTOMATIC FREQUENCY CONTROL OF PURE SINE WAVES

[75] Inventors: David E. Borth, Palatine; James F. M. Kepler, Northbrook, both of Ill.

[73] Assignee: Motorola, Inc., Schaumburg, Ill.

[21] Appl. No.: 285,147

[22] Filed: Dec. 16, 1988

[51] Int. Cl.[4] .............................................. H03L 7/00
[52] U.S. Cl. ........................................ 331/12; 331/25
[58] Field of Search .................... 329/124; 331/11, 12, 331/25, DIG. 2

[56] References Cited

U.S. PATENT DOCUMENTS 3,403,355 9/1968 Takada .................................. 331/12

OTHER PUBLICATIONS

J. C. Samuels, "Theory of the Band-Centering AFC System", IRE Transactions on Circuit Theory, pp. 324–330, Dec. 1957.

Primary Examiner—Eugene R. LaRoche
Assistant Examiner—Robert J. Pascal
Attorney, Agent, or Firm—F. John Motsinger

[57] ABSTRACT

There is provided a method of and apparatus for Automatic Frequency Control (AFC) of pure sine waves (PSW). It comprises discriminating to detect frequency differences between a received pure sine wave and a reference frequency, integrating the frequency differences to average the differences, and adjusting the reference frequency to eliminate the frequency difference. It is further characterized by digitizing, in quadrature, the received pure sine wave, mixing the received pure sine wave with a complex sinusoid to translate the pure sine wave to baseband, quadrature filtering the mixed sine wave, cross-product discriminating to detect frequency differences between a received pure sine wave and a reference frequency, integrating the frequency differences to average the differences, selectively calculating the mean variance between the pure sine wave and the reference frequency, and adjusting the reference frequency of a Voltage Controlled Oscillator to eliminate the frequency difference.

16 Claims, 1 Drawing Sheet

AUTOMATIC FREQUENCY CONTROL ON A PURE SINE WAVE

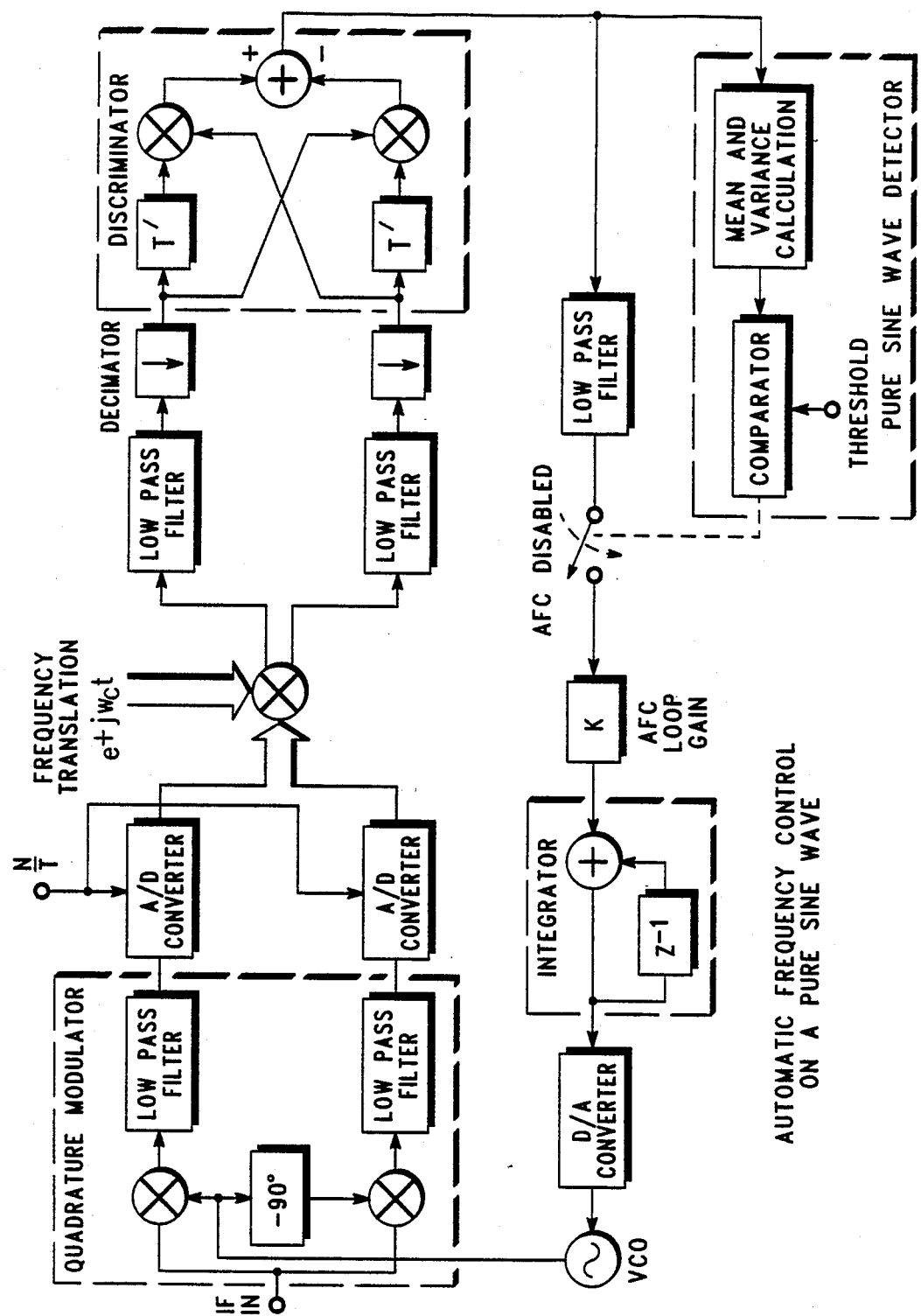

DIGITAL AUTOMATIC FREQUENCY CONTROL OF PURE SINE WAVES

THE FIELD OF INVENTION

This invention is concerned with Automatic Frequency Control (AFC). More particularly, this invention is concerned methods and apparatus for digital Automatic Frequency Control (AFC) on Pure Sine Waves (PSW).

BACKGROUND OF THE INVENTION

The need for AFC in coherently detecting phase modulated signals arises since even small frequency offsets between the transmitter and the receiver reference frequencies can result in a significant number of detected data errors. To demonstrate this problem, consider the following example. Assume data is sent at a 300 Kb/s data rate using Minimum Shift Keying (MSK) (or a variation of this modulation format, such as Gaussian Minimum Shift Keying-GMSK; Generalized Tamed FM-GTFM; etc.) in a Time Division Multiple Access system employing time slots of 0.5 msec in duration. Hence a time slot consists of (300 Kb/s)×(0.5 msec)=150 bits. Assume further that the phase offset between the transmitter and receiver is adjusted to zero at the start of each received time slot through the use of a synchronization preamble, etc. For noise-free conditions, it can be shown that for an MSK modulation format, bits may be detected without error in the receiver provided that the phase offset between the transmitted and receiver is less than $\pi/2$ radians. As instantaneous frequency is the time derivative of phase, in order for the time slot to be received without error, it is necessary that the phase offset at the end of the slot be less than $\pi/2$ radians, i.e., that the frequency offset between the transmitter and the receiver satisfy $$f_{offset} \leq \frac{1}{2\pi} \frac{\pi/2}{0.5 \text{ msec}} = 500 \text{ MHz}$$

To accommodate the effects of noise, in practice, it is necessary that the frequency offset be somewhat smaller than this, typically 200 Hz.

In a mobile radio operating at 900 MHz, a 200 Hz maximum frequency offset between the transmitted carrier and receiver's reference frequency implies that both the transmitter and receiver must employ oscillators having an overall stability (over time, temperature, etc.) of better than 0.1 parts per million (ppm), a stability requirement currently met only by cesium or rubidium frequency standards and ovenized crystal oscillators. All of these oscillators are too bulky for commercial mobile radio applications. Instead, AFC must be employed with a smaller oscillator, compromising frequency stability. Methods must be devised for controlling frequency stability in other ways. AFC circuits are one common way.

Conventional AFC circuits, such as described in J. C. Samuels' "Theory of the Band-Centering AFC System", *IRE Transactions on Circuit Theory*, pp. 324-330, December 1957 are designed to compensate for large frequency offsets between the transmitter and receiver in order to keep the received signal within the bandwidth of the receiver's IF filter. This is usually accomplished via a frequency discriminator detector whose output is low-pass filtered to remove any data artifacts from the received signal's mean frequency. Such an approach is useful in achieving frequency offsets of approximately ±1 KHz at 900 MHz. It is not an acceptable approach towards achieving a frequency offset of less than 200 Hz unless the transmitted signal bandwidth is less than 200 Hz (e.g., a sinusoid). However, even to achieve frequency lock to a sinusoidal signal, it is necessary to carefully further process the received signal.

In practice, in order to achieve initial frequency lock to a received GMSK signal, a sinusoidal burst is transmitted at periodic intervals between data bursts by transmission of a long burst of logic 0's or 1's using the GMSK modulation format. As is well-known, the signal resulting from such a data input is a sinusoidal signal at a frequency equal to the carrier frequency plus or minus one-quarter of the bit rate 1/4T, , i.e.

$$f = f_{carrier} \pm \frac{1}{4T},$$

where the choice of the sign depends upon whether all ones or all zeros are transmitted.

With this sinusoidal burst transmission, locking to the received carrier requires both detection of the sinusoidal burst and frequency locking to the sinusoidal burst.

This invention then takes as its object to overcome these challenges and to realize certain advantages presented below.

SUMMARY OF THE INVENTION

Thus, there is provided a method of and apparatus for Automatic Frequency Control (AFC) of pure sine waves (PSW). It comprises discriminating to detect frequency differences between a received pure sine wave and a reference frequency, integrating the frequency differences to average the differences, and adjusting the reference frequency to eliminate the frequency difference.

It is further characterized by digitizing, in quadrature, the received pure sine wave, mixing the received pure sine wave with a complex sinusoid to translate the sinusoid to 0 Hz, quadrature filtering the mixed sine wave, cross-product discriminating to detect frequency differences between a received pure sine wave and a reference frequency, integrating the frequency differences to average the differences, selectively calculating the mean variance between the pure sine wave and the reference frequency, and adjusting the reference frequency of a Voltage Controlled Oscillator to eliminate the frequency difference.

DESCRIPTION OF THE DRAWINGS

Additional objects, features, and advantages of the invention will be more clearly understood and the best mode contemplated for practicing it in its preferred embodiment will be appreciated (by way of unrestricted example) from the following detailed description, taken together with the accompanying drawings in which:

The single FIGURE is a functional block diagram of the preferred embodiment of the invention.

DETAILED DESCRIPTION

Refer now to the block diagram of the preferred embodiment of the invention.

A conventional quadrature demodulator is employed to mix the received intermediate frequency (IF) signal down to baseband inphase (I) and quadrature (Q) signals. Two Analog-to-Digital converters (A/D) operating at a multiple of the bit rate are employed to sample the quadrature baseband signals and convert these signals into a digital format. Note that all of this circuitry is also required for digital demodulation of GMSK data signals.

The outputs from the A/D converters are subsequently frequency translated by multiplication of the received signal by $e^{+jw_ot}$ where $$w_o = 2\pi \left(\frac{1}{4T}\right)$$

radians/sec. The effect of this translation during reception of the pure sine wave burst without any frequency error is to mix the sine wave to 0 Hz. In the presence of a frequency offset, the frequency-translated I and Q signals will consist of a sinusoid and a cosinusoid, respectively, at a frequency equal to the offset frequency error.

The frequency-translated I and Q signals are subsequently low-pass filtered by the two LPF blocks to remove excess noise and are then downsampled by means of the two decimator blocks. During reception of the pure sine wave, the bandwidth of the received signal will be equal to the frequency error between the received carrier signal and the VCO. Thus, after frequency translation, the I and Q signals will each be bandlimited to the frequency range $$(0, f^{(max)}_{FREQUENCY\ OFFSET})$$

Consequently, the signal after the low-pass filter can be downsampled to $$2 \times f^{(max)}_{FREQUENCY\ OFFSET} = \frac{1}{T'}$$

without violating the Nyquist criterion for sampled data signals.

The decimated, low-pass filtered, frequency-translated quadrature signals are then applied to a baseband discriminator which is realized by means of a cross-product discriminator. The output of such a discriminator for quadrature sinusoidal inputs at a radian frequency of $\Delta W$ radians/sec. may be shown to be $$V_{DISC} = A\ \sin(\Delta WT)$$

where T' is defined as above, and A is a constant of proportionality. Thus for a pure sine wave input to the receiver, the output of the discriminator is a DC signal whose amplitude is proportional to the frequency offset between the received carrier frequency and the VCO frequency.

The output of the cross-product discriminator is then supplied to two separate blocks. The first block, a low-pass filter implemented as a first order IIR filter, is used to smooth the output of the cross-product discriminator to eliminate the effects of input noise. The second block, a pure sine wave detector, is used to detect the presence of a pure sine wave and therefore enable the output of the first block to be connected to the rest of the AFC loop circuit. The pure sine-wave detector consists of a mean and variance calculator and a comparator. The mean and variance calculator computes the mean $$M = \frac{1}{N} \sum_N V$$

and the variance $$\sigma^2 = \left[\frac{1}{N} \sum_N V^2 - M^2\right]$$

of the output of the discriminator. For a pure sine wave input, the mean M is equal to the frequency error while the variance $\sigma^2$ will be small. For data signals or noise, however, the variance will be large. The variance $\sigma^2$ is therefore applied to a comparator which compares the variance to a threshold variance value and closes the AFC disable switch at the output of the discriminator LPF if the variance is less than the threshold.

The output of the AFC disable switch is subsequently applied to an AFC gain term K (which determines the AFC loop dynamics), an integrator, and a Digital-to-Analog converter (D/A). The output of the D/A converter is then applied to the VCO to eliminate any frequency offset between the transmitted carrier and the receiver's VCO reference frequency.

In summary then, there has been provided a method of and apparatus for Automatic Frequency Control (AFC) of pure sine waves (PSW). It comprises discriminating to detect frequency differences between a received pure sine wave and a reference frequency, integrating the frequency differences to average the differences, and adjusting the reference frequency to eliminate the frequency difference.

It is further characterized by digitizing, in quadrature, the received pure sine wave, mixing the received pure sine wave with a complex sinusoidal to translate the sinusoidal to 0 Hz, quadrature filtering the mixed sine wave, cross-product discriminating to detect frequency differences between a received pure sine wave and a reference frequency, integrating the frequency differences to average the differences, selectively calculating the mean variance between the pure sine wave and the reference frequency, and adjusting the reference frequency of a Voltage Controlled Oscillator to eliminate the frequency difference.

While the preferred embodiment of the invention has been described and shown, it will be appreciated by those skilled in the art that other variations and modifications of this invention may be implemented. For example, the IIR filter may be replaced by an equivalent FIR filter; the decimators may be removed yielding a simpler implementation (but requiring more computations/sec.); or the cross-product discriminator may be replaced with another discriminator structure. In addition, the digital portion of the hardware may be implemented either in a digital signal processor IC or in discrete hardware.

These and all other variations and adaptations are expected to fall within the ambit of the appended claims.

What we claim and desire to secure by Letters Patents is:

1. A method of digital Automatic Frequency Control (AFC) on pure sine waves (PSW) comprising:
   discriminating, with reference to a reference frequency, to detect frequency differences between a received pure sine wave and a reference waveform, integrating the frequency differences to average the differences, and adjusting the reference frequency to eliminate the frequency difference.

2. The method as claimed in claim 1, wherein discrimination further comprises cross-product discrimination.

3. The method as claimed in claim 1, wherein discrimination is preceded by mixing the received pure sine wave with a complex sinusoid reference waveform to translate it to 0 Hz.

4. The method as claimed in claim 3, wherein quadrature filtering of the mixed sine wave is interposed between mixing and discrimination.

5. The method as claimed in claim 3, wherein mixing is preceded by digitizing, in quadrature, the received pure sine wave.

6. The method as claimed in claim 1, wherein adjustment further comprises adjusting the frequency of a Voltage Controlled Oscillator to eliminate the frequency difference.

7. The method as claimed in claim 1, wherein the variance between the pure sine wave and the reference waveform is utilized to selectively invoke the frequency adjustment.

8. The method as claimed in claim 1, wherein marginal variances between the pure sine wave and the reference waveform are utilized to invoke the frequency adjustment.

9. The method as claimed in claim 1, wherein substantial variances between the pure sine wave and the reference waveform are utilized to suspend the frequency adjustment.

10. A method of digital Automatic Frequency Control (AFC) on bursted pure sine waves (PSW) comprising:

cross-product discriminating, with reference to a reference frequency, to detect frequency differences between a received pure sine wave burst and a reference waveform, integrating the frequency differences to average the differences, and adjusting the frequency of a Voltage Controlled Oscillator reference to eliminate the frequency difference.

11. A method of digital Automatic Frequency Control (AFC) on bursted pure sine waves (PSW) comprising:

digitizing, in quadrature, the received pure sine wave, mixing the received pure sine wave with a complex sinusoid reference waveform to translate it to 0 Hz, quadrature filtering the mixed sine wave, cross-product discriminating to detect frequency differences between a received pure sine wave and the reference waveform, integrating the frequency differences to average the differences, and adjusting the frequency of a Voltage Controlled Oscillator reference to eliminate the frequency difference.

12. A method of digital Automatic Frequency Control (AFC) on bursted pure sine waves (PSW) comprising:

digitizing, in quadrature, the received pure sine wave, mixing the received pure sine wave with a complex sinusoid reference waveform to translate it to 0 Hz, quadrature filtering the mixed sine wave, cross-product discriminating to detect frequency differences between a received pure sine wave and the reference waveform, integrating the frequency differences to average the differences, adjusting the frequency of a Voltage Controlled Oscillator reference to eliminate the frequency difference, and selected invoking frequency adjustment based upon the variances between the pure sine wave and the reference waveform.

13. An apparatus for digital Automatic Frequency Control (AFC) of pure sine waves (PSW) comprising, coupled in series:

means for discriminating, with reference to a reference frequency, to detect frequency differences between a received pure sine wave and a reference waveform, and means for integrating the frequency differences to average the differences and for adjusting the reference frequency to eliminate the frequency difference.

14. An apparatus for digital Automatic Frequency Control (AFC) of pure sine waves (PSW) comprising, coupled in series:

means for digitizing, in quadrature, the received pure sine wave, means for mixing the received pure sine wave with a complex sinusoid reference waveform to translate it to 0 Hz, means for quadrature filtering the mixed sine wave, means for cross-product discriminating to detect frequency differences between a received pure sine wave and the reference waveform, and means for integrating the frequency differences to average the differences and for adjusting the frequency of a Voltage Controlled Oscillator reference to eliminate the frequency difference.

15. An apparatus for digital Automatic Frequency Control (AFC) of pure sine waves (PSW) comprising, coupled in series:

means for digitizing, in quadrature, the received pure sine wave, means for mixing the received pure sine wave with a complex sinusoid reference waveform to translate it to 0 Hz, means for quadrature filtering the mixed sine wave, means for cross-product discriminating to detect frequency differences between a received pure sine wave and the reference waveform, means for integrating the selected frequency differences to average the differences and for adjusting the frequency of a Voltage Controlled Oscillator reference to eliminate the frequency difference, and means for selectively invoking frequency adjustment based upon the variances between the pure sine wave and the reference waveform.

16. A method of digital Automatic Frequency Control (AFC) on bursted pure sine waves (PSW) comprising:

discriminating, with reference to a reference frequency, to detect frequency differences between a received pure sine wave burst and a reference waveform, integrating the frequency differences to average the differences, and adjusting the reference frequency to eliminate the frequency difference.

* * * * *

UNITED STATES PATENT AND TRADEMARK OFFICE
CERTIFICATE OF CORRECTION

PATENT NO. : 4,910,470
DATED : 3/20/90
INVENTOR(S) : BORTH ET AL.

It is certified that error appears in the above-identified patent and that said Letters Patent is hereby corrected as shown below: ON TITLE PAGE: item [54] and in column 1

In the Title, line 2, "of" should be --on--.

At Col. 1, line 8, between the words "concerned" and "methods", insert therefor --with--.

At Col. 1, line 31, "transmitted" should be --transmitter--.

At Col. 1, line 40, "$\leq$" should be --$\leq$--.

At Col. 1, line 40, "500 MHz" should be --500 Hz--.

At Col. 2, line 47, "mean variance" should be --mean/variance--.

At Col. 2, line 15, "1/4T" should be --$\frac{1}{4T}$--.

At Col. 3, line 38, "$=\frac{1}{T}$" should be --$=\frac{1}{T'}$--.

At Col. 3, line 49, "$V_{DISC}=A \sin(\Delta WT)$" should be --$V_{DISC}=A\sin(\Delta WT')$--.

Signed and Sealed this

Twenty-third Day of June, 1992

*Attest:*

DOUGLAS B. COMER

*Attesting Officer*  *Acting Commissioner of Patents and Trademarks*